United States Patent
Roiz et al.

(10) Patent No.: US 11,082,016 B2
(45) Date of Patent: Aug. 3, 2021

(54) AMPLIFIER DEVICES WITH REFLECTION ABSORPTION

(71) Applicant: NXP USA, INC., Austin, TX (US)

(72) Inventors: Arturo Roiz, Tempe, AZ (US); Justin Nelson Annes, Chandler, AZ (US); Terry L. Thomas, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 77 days.

(21) Appl. No.: 16/413,484

(22) Filed: May 15, 2019

(65) Prior Publication Data
US 2020/0366257 A1    Nov. 19, 2020

(51) Int. Cl.
| | | |
|---|---|---|
| H03F 1/07 | (2006.01) | |
| H03F 3/195 | (2006.01) | |
| H03F 3/21 | (2006.01) | |
| H03F 1/56 | (2006.01) | |
| H03F 1/32 | (2006.01) | |
| H03F 3/60 | (2006.01) | |

(52) U.S. Cl.
CPC .......... *H03F 3/195* (2013.01); *H03F 1/3205* (2013.01); *H03F 1/565* (2013.01); *H03F 3/21* (2013.01); *H03F 3/608* (2013.01)

(58) Field of Classification Search
CPC ................................ H03F 1/07; H03F 1/0288
USPC .............................................. 330/124 R, 295
See application file for complete search history.

(56) References Cited

U.S. PATENT DOCUMENTS

| | | | |
|---|---|---|---|
| 6,670,801 B2 | 12/2003 | Jian et al. | |
| 6,838,989 B1 * | 1/2005 | Mays ................. | G06K 19/0723 340/572.1 |
| 7,372,334 B2 | 5/2008 | Blair et al. | |
| 8,164,387 B1 | 4/2012 | Apel et al. | |
| 8,299,856 B2 | 10/2012 | Blair | |
| 8,659,359 B2 | 2/2014 | Ladhani et al. | |
| 8,896,373 B2 | 11/2014 | Mei | |
| 9,035,715 B2 * | 5/2015 | Mei .......................... | H03F 1/56 333/33 |
| 9,106,187 B2 | 8/2015 | Ladhani et al. | |
| 9,337,784 B2 | 5/2016 | Kim et al. | |
| 9,762,185 B2 | 9/2017 | Ladhani et al. | |
| 10,243,525 B2 * | 3/2019 | Nagasaku ............. | H03F 1/0288 |
| 10,270,402 B1 | 4/2019 | Holmes et al. | |
| 10,594,266 B2 * | 3/2020 | Krehbiel ................. | H03F 1/565 |

(Continued)

OTHER PUBLICATIONS

Jangheon, Kim, et al., "Advanced Design of Linear Doherty Amplifier for High Efficiency using Saturation Amplifier," 2007 IEEE/MTT-S International Microwave Symposium, pp. 1573-1576 (Jun. 2007)(*1-4244-0688-9/07 EEE publication).

(Continued)

*Primary Examiner* — Henry Choe
(74) *Attorney, Agent, or Firm* — Sherry W. Schumm

(57) ABSTRACT

A radio frequency (RF) amplifier configured to operate at a fundamental frequency ($f_0$) includes a transistor with a transistor output, an output matching network coupled to the transistor output, and a reflection absorption circuit. The output matching network includes an output path device connected between the transistor output and an output of the RF amplifier. The reflection absorption circuit is coupled between the transistor output and the output path device, and is configured to absorb reflected signal energy from the output path device.

18 Claims, 7 Drawing Sheets

(56) References Cited

U.S. PATENT DOCUMENTS

| | | | |
|---|---|---|---|
| 10,673,387 B2* | 6/2020 | Srindhi Embar | H03F 3/195 |
| 10,742,174 B2 | 8/2020 | Roberts et al. | |
| 2017/0011785 A1 | 1/2017 | Berge et al. | |
| 2018/0024135 A1 | 1/2018 | Khandare et al. | |
| 2019/0131938 A1* | 5/2019 | Qureshi | H03F 1/0288 |

OTHER PUBLICATIONS

U.S. Appl. No. 16/413,433; Non Final Office Action; 8 pages (dated Oct. 14, 2020).
Notice of Allowance; U.S. Appl. No. 16/413,433; 9 pages (dated Feb. 12, 2021).

* cited by examiner

AMPLIFIER DEVICES WITH REFLECTION ABSORPTION

TECHNICAL FIELD

Embodiments of the subject matter described herein relate generally to amplifiers, and more particularly to radio frequency (RF) power amplifiers used in a variety of applications.

BACKGROUND

In general, amplifiers are used to increase the power of signals. For example, in some applications amplifiers can be used to convert low-power radio frequency (RF) signals into larger RF signals for driving the antenna of a transmitter. In such cases, amplifiers may be implemented as part of an overall power amplifier used by an RF transmission system.

One reoccurring issue in RF power amplifiers is excessive noise at the output of the RF power amplifier. When excessive noise is generated at the output of the RF power amplifier that noise can then propagate through the system. The excessive noise can thus significantly impact the overall performance of the system.

One type of noise that can be especially problematic for some RF application are called intermodulation product distortions, also referred to as intermodulation distortion (IMD). Intermodulation product distortion is a type of noise that results from the interaction and modulation of two or more signals with different frequencies. For example, intermodulation product distortion can be caused by nonlinearities when amplifiers are operated near the compression point. Specifically, at compression a typical amplifier can no longer linearly amplify the input signal properly and will thus distort the output signal. This distorted output signal will include additional harmonic copies at multiples of the fundamental frequency but with lower magnitudes levels. These harmonic copies can then interact and combine with each other by addition and subtraction, thereby creating additional signals at other frequencies. These signals, generally called intermodulation products, can fold back and interfere with other signals, including adjacent allocated signals.

Of particular concern are the intermodulation products that fall within the operational RF band. If large enough these intermodulation product distortions can result in impaired amplifier performance. For example, these intermodulation product distortions can impair wideband operation or reduce amplifier linearity, where amplifier linearity is a measurement of how accurate the output signal is compared to the input signal applied to the input of the amplifier, particularly when generating high power. One type of application that is particularly sensitive to intermodulation product distortions are high power pulse amplifiers.

Therefore, there remains a need for amplifiers with reduced susceptibility to noise, including intermodulation product distortions, particularity for high power RF applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein can provide amplifiers, and particularly radio frequency (RF) power amplifiers, with improved performance. Specifically, the embodiments described herein include amplifiers with one or more reflection absorption circuits coupled to one or more transistor(s) outputs. These reflection absorption circuits can be implemented to mitigate unwanted effects of signal reflections at the transistor outputs that could otherwise lead to excessive noise, including intermodulation product distortions. By reducing the effects of noise the reflection absorption circuits can increase amplifier linearity in high frequency, high bandwidth, high power RF amplifiers. For example, the reflection absorption circuits can facilitate high power pulse amplifiers with increased amplifier linearity.

In general, the reflection absorption circuits are configured to absorb signal reflections at the transistor output in RF amplifiers used for high power amplification of the operational signals (i.e., the information-bearing signals intended for amplification and transmission). As such, the reflection absorption circuits can facilitate the use of certain bandwidth limited output path devices in the output path of the RF amplifier. For example, the reflection absorption circuits can facilitate the use of certain packaged impedance transformation devices as output path devices. As other examples, the reflection absorption circuits can facilitate the use of certain frequency circulators as output path devices. In both cases the bandwidth limited devices can cause unwanted signal reflections that could propagate back to the transistor output and cause excessive noise, including intermodulation product distortions. The reflection absorption circuits provided in accordance with the embodiments described herein can absorb these reflections and reduce the noise caused by those reflections. As such, the reflection absorption circuits can facilitate the use of these bandwidth limited output path devices in amplifiers where they would otherwise cause excessive noise. As will be described below, in some embodiments these bandwidth limited devices can facilitate reduced device size and can in some cases reduce the noise at the amplifier output by preventing the propagation of unwanted harmonic signals to the amplifier output.

Figure 1:
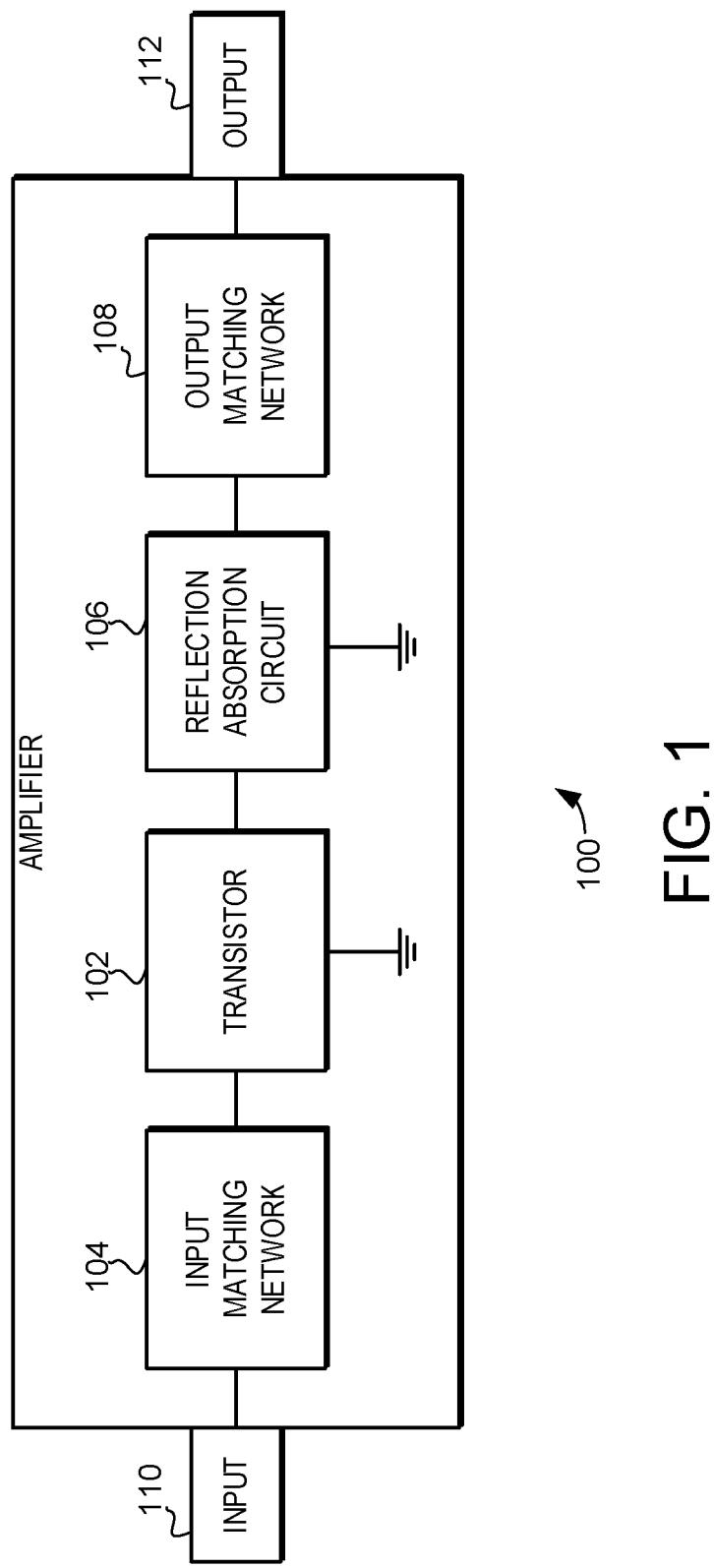
FIG. 1 is a schematic diagram of an amplifier in accordance with an example embodiment.

Turning now to FIG. 1, a schematic diagram of a portion of an exemplary amplifier 100 is illustrated. The amplifier 100 includes a transistor 102, an input matching network 104, a reflection absorption circuit 106, an output matching network 108, an RF input node 110, and an output load node 112 connected in series as shown. Although transistor 102 is referred to in the singular sense, transistor 102 may include a single-stage transistor, a two-stage transistor (e.g., a series combination of a driver amplifier transistor and a final-stage amplifier transistor), or another transistor/amplifier topology.

The reflection absorption circuit 106 is coupled to an output of the transistor 102. In general, the reflection absorption circuit 106 is configured to reduce noise at the output of the transistor 102 by selectively absorbing (e.g., dissipating and/or shunting to a ground reference node) the signal energy of certain reflected signal energy at the output of the transistor 102.

Specifically, the reflection absorption circuit 106 can be configured to provide a low impedance path to a ground reference node for signal energy below a selected frequency (e.g., below the video bandwidth frequencies of the amplifier 100). By providing this low impedance path to a ground reference node for this signal energy, the reflection absorption circuit 106 can significantly reduce the noise and other undesirable effects of that reflected signal energy. Conversely, the reflection absorption circuit 106 can be configured to present high impedance to signal energy at selected higher frequencies to avoid negatively impacting the operation of the amplifier 100 at those high frequencies. For example, the reflection absorption circuit 106 can be designed to present an open circuit for high frequency RF signal energy near the fundamental frequency of operation of the amplifier ($f_O$). As used herein, the term "near" with respect to a particular frequency (e.g., any of $f_B$, $f_O$, or another frequency) may mean within 20 percent of the particular frequency, for example.

In one embodiment, the reflection absorption circuit 106 is configured to absorb reflected signal energy having frequencies below a baseband frequency ($f_B$). To facilitate this, the reflection absorption circuit 106 is configured to provide a low impedance profile for selected frequencies below the baseband frequency ($f_B$). For example, the reflection absorption circuit 106 can be configured to provide a low impedance profile and thus absorb reflected signal energy from about 0.2 $f_B$ to 0.8 $f_B$.

As noted above, the reflection absorption circuit 106 can significantly reduce the undesirable effects of reflected signal energy by providing a low impedance path to a ground reference node for that signal energy. For example, the low impedance path for reflected signal energy can significantly reduce the peak voltages generated at the output of the transistor 102 by that reflected signal energy.

Specifically, the peak voltages generated by undesirable reflected signal energy are determined at least in part by current of the reflected signal energy and impedance seen by these currents as the reflected signal energy is dissipated and/or shunted to a reference node. Thus, the low impedance path presented to the reflected signal energy by the reflection absorption circuit 106 can significantly reduce the peak voltages generated by that reflected signal energy. This reduction in peak voltages caused by reflected signal energy can reduce stresses on the transistor 102. Specifically, this reduction in peak voltages can prevent the peak voltages from reaching beyond the breakdown safe limits of the transistor 102. Finally, resistances in the absorption reflection circuit 106 can dissipate and dampen the current caused reflected signal energy, providing additional protection to the transistor 102.

The reflection absorption circuit 106 can be implemented to provide this selective signal absorption with a variety of devices and circuits. For example, the reflection absorption circuits can be implemented with one or more baseband termination circuits arranged in parallel. In such embodiments each of the baseband termination circuits can be implemented to provide a low impedance profile for different frequency bandwidths. In such an embodiment each baseband termination circuit can include one or more capacitors, inductors, and resistors, with the capacitors and inductors configured to resonate at a resonant frequency, and provide a low impedance path when resonating for signal energy at and near the resonant frequency. Detailed examples of such baseband termination circuits will be described below with reference to FIGS. 2A and 2B.

As described above, the reflection absorption circuit 106 is configured to absorb (e.g., dissipate and/or shunt to a ground reference node) signal reflections at the output of the transistor 102 and as such can facilitate high frequency, high bandwidth and high power RF applications. Furthermore, this use of the reflection absorption circuit 106 can facilitate the use of certain bandwidth limited devices in the output path of the amplifier 100. Such bandwidth limited devices can have a relatively narrow effective bandwidth, where the effective bandwidth of the device is the bandwidth for which the device is implemented to operate and outside of which the device may undesirably reflect a significant amount of signal energy.

For example, the reflection absorption circuit 106 can facilitate the use of certain packaged devices in the implementation of amplifier 100. As one specific example, the reflection absorption circuit 106 can facilitate the use of packaged impedance transformers as part of the output matching network 108. These packaged impedance transformers can provide several advantages over other implementations but in many cases packaged impedance transformers have relatively narrower effective bandwidths. For example, they can facilitate a reduction in device size. Specifically, the use of packaged impedance transformers can facilitate reduced printed circuit board (PCB) footprint for the amplifier 100. Additionally, a packaged impedance transformer can result in a cleaner output signal by not passing unwanted harmonic signals or other undesirable signals to the output 112.

When used in the output matching network 108 of a high frequency and a high bandwidth amplifier such as amplifier 100, the relatively narrow effective bandwidth of the packaged impedance transformer can result excessive signal reflection as signal energy outside that narrow bandwidth may be reflected rather than passing through the impedance transformer. As was described above, this reflected signal energy can propagate back to the output of the amplifier 100, and can there generate potential noise and impair performance of the amplifier 100. As such, these packaged impedance transformers have generally not been used in the output path of high frequency and high bandwidth amplifiers. Instead, they have generally been limited to the less demanding applications, such as low frequency, narrow bandwidth amplifiers. Likewise, they have been limited to applications on the input of the side of the amplifier 100. As described above, the reflection absorption circuit 106 can absorb these reflections and thus facilitate the use of packaged impedance transformers and other bandwidth limited devices in the output path of the amplifier 100.

Other examples of bandwidth limited devices that can be facilitated with the use of reflection absorption circuit 106 include frequency circulators. In general, frequency circulators are three terminal devices that provide one way signal flow. Specifically, frequency circulators allow signals to propagate from an input terminal to an output terminal but not in the opposite direction. However, some frequency circulators also have a relatively narrow effective bandwidth that can also result in excessive signal reflection when used in the output path of high frequency and high bandwidth amplifiers. As described above, the reflection absorption circuit 106 can absorb these reflections and thus facilitate the use of such frequency circulators in the output path of the amplifier 100.

In a typical embodiment the transistor 102 is formed on a transistor die and is encased in a device package that includes at least a first input lead and a first output lead. In such an embodiment the reflection absorption circuit 106 can include at least a first inductance and at least a first capacitance, where at least the first capacitance is formed on an integrated passive device (IPD) die. In such an embodiment the IPD die can be encased inside the device package with the transistor die. In other embodiments, at least the first capacitance could be formed on a small printed circuit board, in or on a ceramic substrate (e.g., a low temperature co-fired ceramic (LTCC) substrate), or in or on another type of substrate that can be encased inside the device package with the transistor die.

In yet other embodiments, the reflection absorption circuit 106 can include at least a first inductance and at least a first capacitance, where at least the first capacitance is coupled to a first output trace, where the first output input trace is coupled to the first output lead. Examples of such embodiments will be described with reference to FIG. 3.

As noted above, the reflection absorption circuit 106 is coupled to the output of the transistor 102. For example, the reflection absorption circuit 106 can be coupled to the output or current conducting terminal (e.g., a source terminal or collector terminal) of the transistor 102.

The transistor 102 can be implemented with a variety of different types of transistors, including field effect transistors (FETs) and bipolar junction transistors (BJTs), to give two non-limiting examples. In one specific embodiment, the transistor 102 comprises a gallium nitride (GaN) field-effect transistor (FET). As more specific examples, various III-V field effect transistors may be used (e.g., a high electron mobility transistor (HEMT)), such as a GaN FET (or another type of III-V transistor, including a gallium arsenide (GaAs) FET, a gallium phosphide (GaP) FET, an indium phosphide (InP) FET, or an indium antimonide (InSb) FET). In other examples the transistor 102 may be implemented with a III-V FET or with a silicon-based FET (e.g., a laterally-diffused metal oxide semiconductor (LDMOS) FET). In each of these cases the reflection absorption circuit 106 is coupled to the output of the transistor 102 (e.g., the drain terminal) and is configured to absorb (e.g., dissipate or shunt to a ground reference node) certain reflected signal energy at the output.

It should be noted that amplifier 100 is a simplified representation of a portion of an amplifier, and in a more typical implementation the amplifier 100 would include additional features not illustrated in FIG. 1. For example, the amplifier 100 could include a variety of bias circuits. As other examples, the amplifier 100 could include additional transistors 102. Additionally, in some embodiments the amplifier 100 could include additional amplification paths, with each path including at least an additional reflection absorption circuit 106 and transistor 102. Furthermore, the amplifier 100 could be implemented as a variety of different types of amplifiers, including class AB amplifiers. As specific examples, the amplifier 100 can be implemented as a single path class AB amplifier.

In other examples, the amplifier 100 can be implemented as part of a multi-path Doherty amplifier that uses a combination of class AB and class C paths. In such an embodiment, a second instantiation of amplifier 100 may be implemented in parallel with amplifier 100, the transistor 102 can be implemented as a carrier transistor, and a second instantiation of transistor 102 (in the second instantiation of amplifier 100) can be implemented as a peaking transistor. In such an amplifier a second instantiation of reflection absorption circuit 106 (in the second instantiation of amplifier 100) can be implemented where the second reflection absorption circuit configured to absorb reflected signal energy at a second transistor output. An example of such an embodiment will be discussed in greater detail with reference to FIG. 5.

As noted above, a variety of different types of devices and circuits can be used to implement the reflection absorption circuit 106. For example, the reflection absorption circuit 106 can be implemented with one or more baseband termination circuits arranged in parallel. In general, a baseband termination circuit is a circuit configured to behave as a broadband low impedance circuit for frequencies below the amplifier baseband, and behave as a high impedance circuit for signal energy at and near the fundamental frequency ($f_0$). In such embodiments, each of the baseband termination circuits can be implemented to provide a low impedance profile for a selected frequency range, and each of the baseband termination circuits will thus absorb (e.g., dissipate and/or shunt to a ground reference node) reflected signal energy over its selected frequency range. In some embodiments, multiple baseband termination circuits can be implemented, with the multiple baseband termination circuits configured with overlapping low impedance profiles (e.g., overlapping low impedance frequency ranges). When implemented together, these multiple baseband termination circuits provide a combined frequency range with a wider overall low impedance profile. Thus, reflected signal energy within the combined frequency range is absorbed by the reflection absorption circuit 106, while signal energy with frequencies outside this combined frequency range are presented with a high impedance and are not absorbed.

Figure 2A:
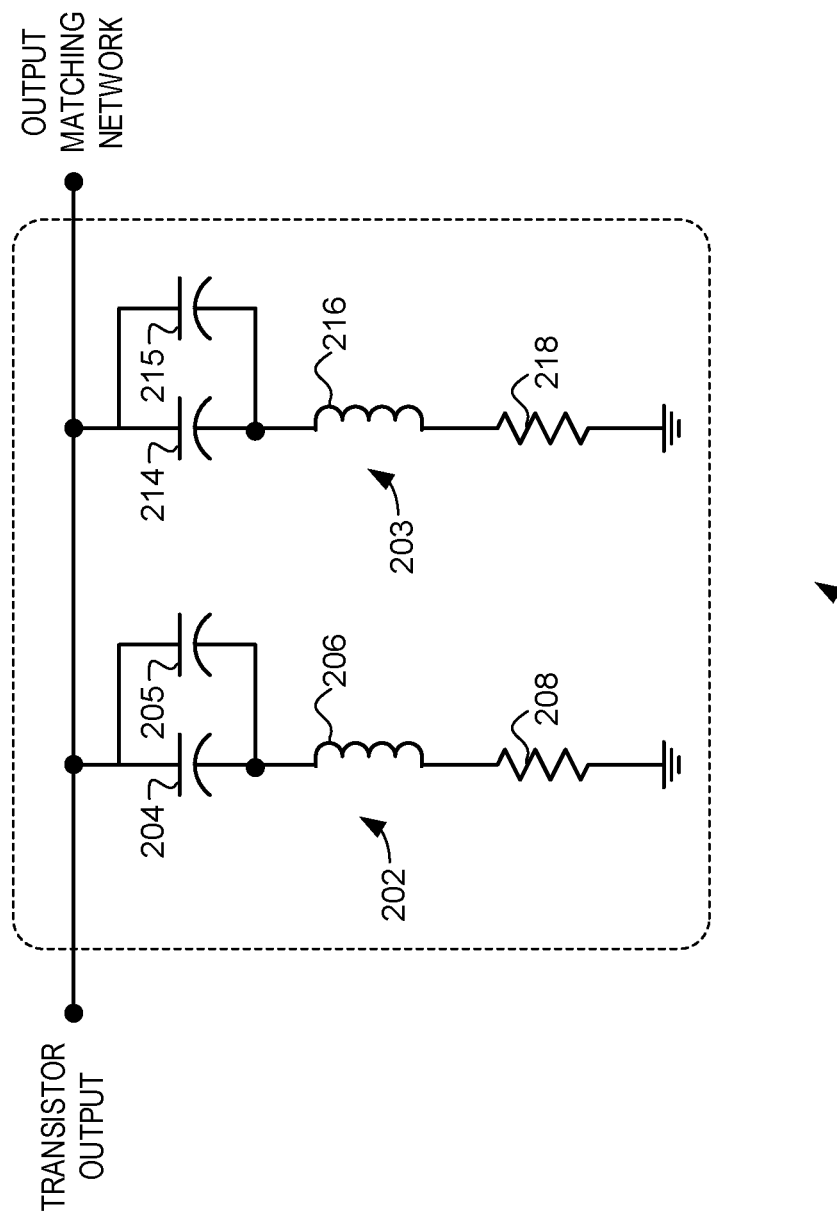
FIGS. 2A and 2B are schematic diagrams of reflection absorption circuits in accordance with example embodiments.

Turning now to FIG. 2A, an exemplary reflection absorption circuit 200 is illustrated. In general, the reflection absorption circuit 200 is configured to be coupled along a signal transmission path between a transistor output and an output matching network. So implemented, the reflection absorption circuit 200 can reduce noise at the output of a transistor by selectively absorbing (e.g., dissipating and/or shunting to a ground reference node) certain reflected signal energy at the output of the transistor. Specifically, the reflection absorption circuit 200 provides a low impedance path to a ground reference node for reflected signal energy in selected frequency ranges.

In the example of FIG. 2A, the reflection absorption circuit 200 includes two baseband termination circuits 202 and 203. Each of the two baseband termination circuits 202 and 203 is configured to absorb (e.g., dissipate and/or shunt to a ground reference node) reflected signal energy over a different selected frequency range, where the different passband frequency ranges of circuits 202 and 203 are overlapping. Thus, when combined in parallel, the two baseband termination circuits 202 and 203 can absorb reflected signal energy over a relatively large combined frequency bandwidth (e.g., a bandwidth that extends from a low frequency cutoff of circuit 202 to a high frequency cutoff of circuit 203).

Each of the two baseband termination circuits 202 and 203 includes a first capacitive element 204, 214, a second capacitive element 205, 215, a first inductive element 206, 216, and a first resistive element 208, 218, where an "element" may include a single component or a network of components. In this configuration, each of the baseband termination circuits 202 and 203 is configured to resonate at different selected frequencies and provide a low impedance path to a ground reference node for signal energy at these selected frequencies. Specifically, the first capacitive element 204, 214 and the first inductive element 206, 216 will resonate at a first frequency, the second capacitive element 205, 215 and the first inductive element 206, 216 will resonant at a second frequency, and the combination of first capacitive element 204, 214, second capacitive element 205, 215, and first inductive element 206, 216 will resonate at a third frequency. Thus, each baseband termination circuit 202 and 203 can resonate at three different frequencies, and the overall reflection absorption circuit 200 can thus resonant at six different frequencies. Taken together, this resonating at six different frequencies provides the reflection absorption circuit 200 with the ability to absorb reflections over a relatively wide combined frequency range. Furthermore, this combined frequency range can be determined by implementing appropriate values for the first capacitive elements 204, 214, second capacitive elements 205, 215, and inductive elements 206, 216.

For example, when the fundamental frequency of operation of the amplifier is between about 800 megahertz (MHz) and about 6.0 gigahertz (GHz), capacitance values of the capacitive elements 204, 214 may be in a range of about 1 nanofarads (nF) to about 10 nF, capacitance values of the capacitive elements 205, 215 may be in a range of about 82 nF to about 120 nF, inductance values of the inductive elements 206, 216 may be in a range of about 0.25 nanohenries (nH) to about 1 nH, and the resistance values of the resistive elements 208, 218 may be in a range of about 1 ohm to about 3.9 ohms. In other embodiments, the capacitive, inductive, and/or resistive values may be smaller or larger than the above-listed ranges. In addition, the fundamental frequency of operation may be less than 800 MHz or greater than 6.0 GHz.

Signal energy within this combined frequency bandwidth are dissipated into one of the corresponding resistive elements 208, 218 and/or shunted to a ground reference node. In contrast, signal energy outside this combined frequency bandwidth is presented with relatively high impedance and is thus not absorbed, but rather passed relatively unaffected between the transistor output and the output matching network.

Figure 2B:
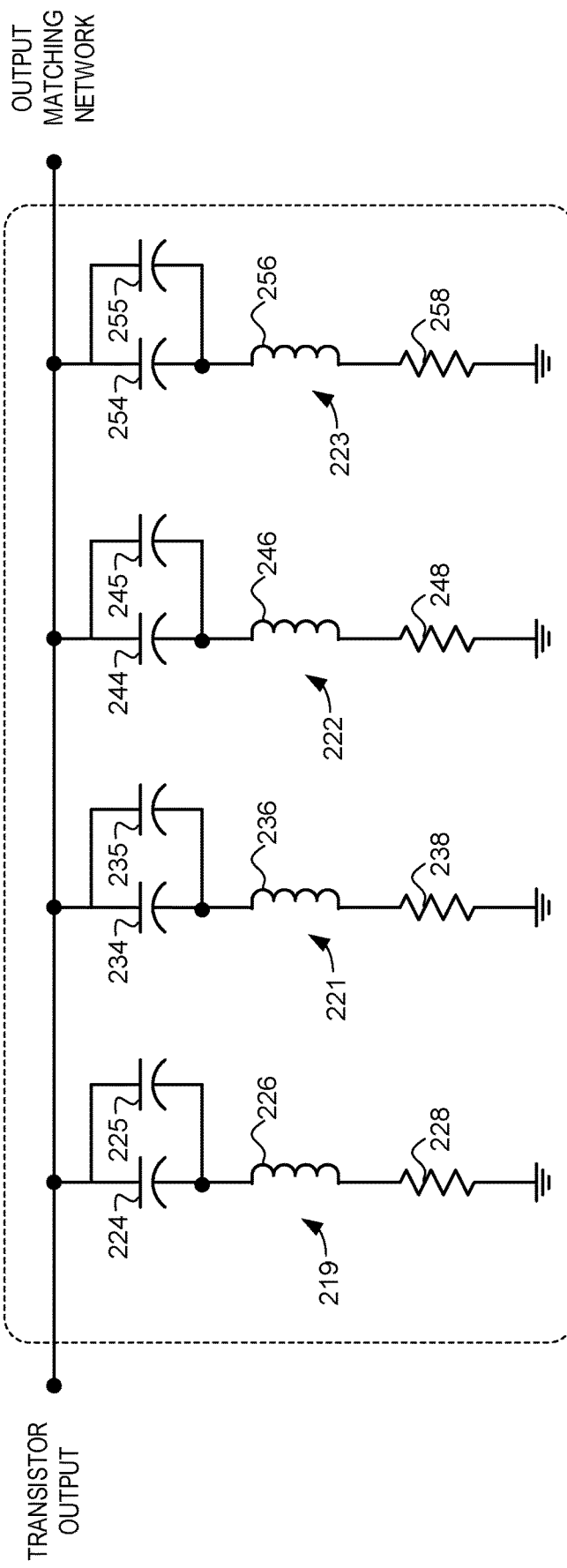

Turning now to FIG. 2B, an exemplary reflection absorption circuit 220 is illustrated. Again, the reflection absorption circuit 220 is configured to be coupled between an output matching network and the transistor output, and is implemented to reduce noise at the output of a transistor by selectively absorbing (e.g., dissipating and/or shunting to a ground reference node) certain reflected signal energy at the output of the transistor.

In the example of FIG. 2B, the reflection absorption circuit 220 includes four baseband termination circuits 219, 221, 222 and 223 arranged in parallel. Each of the four baseband termination circuits 219, 221, 222 and 223 is again configured to absorb reflected signal energy over a different selected frequency range, where the different passband frequency ranges of circuits 219, 221, 222 and 223 are overlapping. Thus, when coupled together in parallel, the four baseband termination circuits 219, 221, 222 and 223 can absorb reflected signal energy over a relatively large combined frequency bandwidth (e.g., a bandwidth that extends from a low frequency cutoff of circuit 219 to a high frequency cutoff of circuit 223). By using the four baseband termination circuits instead of two, the reflection absorption circuit 220 can absorb (e.g., dissipate or shunt to a ground reference node) signal energy over a larger frequency range.

It should be noted that reflection absorption circuits 200 and 220 are just two examples of reflection absorption circuits. For example, although the capacitive, inductive, and resistive elements are shown in a particular series-coupled order in FIGS. 2A and 2B (i.e., C-L-R), these elements may be arranged in different orders, in other embodiments (e.g., C-R-L, L-C-R, L-R-C, R-C-L, or R-L-C), and/or some or all of any of these elements may be implemented using multiple components arranged in various orders with both series- and/or parallel-connected components (e.g., C-L-C-R-L-R, to name just one example). Furthermore, other types of resistor-inductor-capacitor (RLC) circuits can be implemented to absorb reflected signal energy. As used herein, the term "RLC" circuit means a circuit that includes any arrangement of resistive, inductive, and capacitive components between two nodes.

Returning to FIG. 1, in general it is desirable to position the reflection absorption circuit 106 as physically close as possible to the output of the transistor 102. Specifically, it is generally desirable for the reflection absorption circuit 106 to be physically close to the current conducting terminal of the transistor 102 (e.g., the drain terminal when the transistor 102 is a FET). Locating the reflection absorption circuit 106 relatively far away from the output of the transistor 102 could result in increased performance losses. For example, locating the reflection absorption circuit 106 relatively far away can result in increased parasitic impedances that cause excessive performance losses due to the resulting impedance mismatching. A variety of different techniques and structures can be use to implement the reflection absorption circuit 106 in a way that facilitates this close physical proximity to the output of the transistor 102.

As noted above, the transistor 102 is typically formed on a transistor die (i.e., a semiconductor die that includes the transistor), where the transistor die is then encased in a device package that includes one or more input leads and output leads. The device package that includes the transistor 102 can then be mounted on a substrate (e.g., a printed circuit board). The printed circuit boards can include one or more conductive traces, such as conductive input traces used to provide the electrical coupling to the input of the transistor 102, and conductive output traces used to provide the electrically coupling to the output of the transistor 102. Thus, when the device package that includes the transistor 102 is mounted to the printed circuit board, the input lead(s) of the device package are electrically coupled to the conductive input traces on the printed circuit board, and the output lead(s) of the device package are electrically coupled to the conductive output traces on the printed circuit board. Additionally, in some embodiments bias line traces are used to provide bias voltages to the inputs and/or outputs of the transistor 102 (e.g., through the input/output leads and/or through dedicated bias leads).

In some embodiments, the reflection absorption circuit 106 can be incorporated with the output traces on the printed circuit board to provide a close proximity between the reflection absorption circuit 106 and the output of the transistor 102. In such embodiments the resistive, capacitive and inductive elements that implement the reflection absorption circuit can be formed on or attached to the printed circuit board in close proximity to the transistor 102. For example, one or more discretely packaged resistors, capacitors and/or inductors can be mounted on the printed circuit board in a way that connects those elements to the output traces in close proximity to the output of the transistor 102 (or to the output lead of the device package). In other embodiments, one or more discretely packaged resistors, capacitors and/or inductors can be mounted on the printed circuit board in a way that connects those elements to the bias line traces in close proximity to the output of the transistor 102. In other embodiments the resistive, capacitive and/or inductive elements can be formed from one or more additional traces on the printed circuit board, where those additional traces are again in close proximity to the output of the transistor 102.

Figure 3:
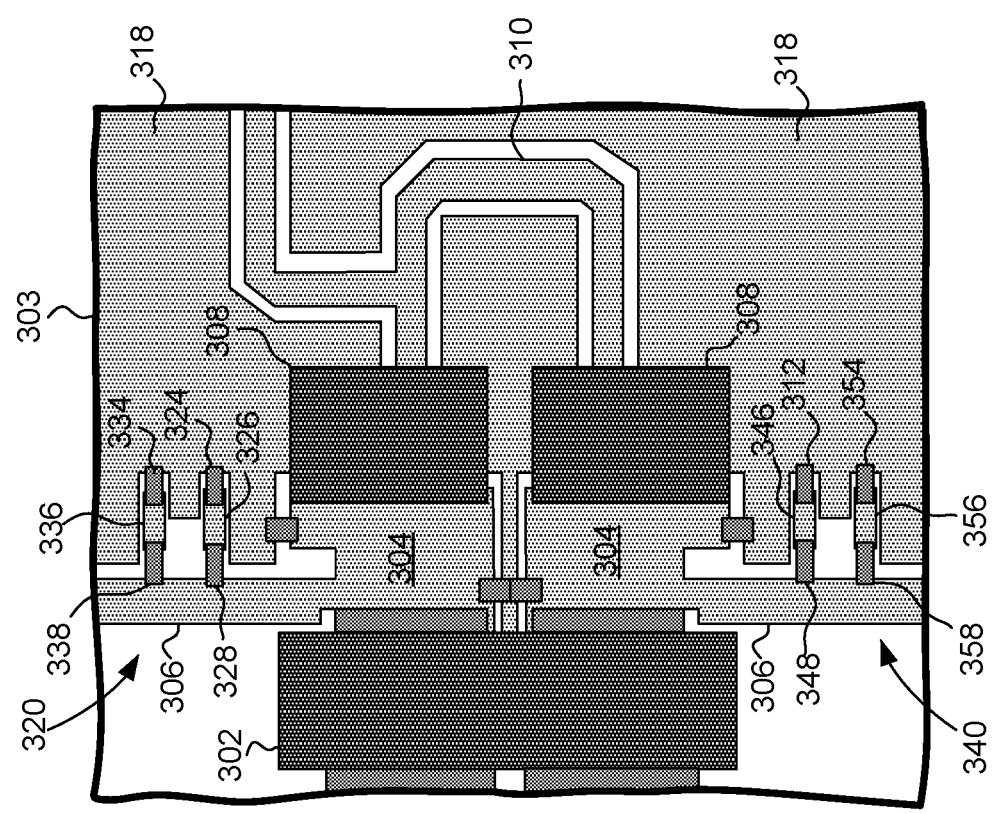
FIG. 3 is a top view of a portion of an amplifier in accordance with an example embodiment.

Turning now to FIG. 3, a schematic view of a portion of an amplifier 300 is illustrated. The amplifier 300 includes packaged transistor device 302 and packaged impedance transformers 308 mounted to a printed circuit board 303. The packaged impedance transformers 308 each represent a bandwidth limited output path device in the output path of the amplifier 300, which could cause unwanted signal reflections that could propagate back to the transistor output and cause excessive noise, including intermodulation product distortions, in the absence of reflection absorption circuits implemented on the printed circuit board 303, as described below. The reflection absorption circuits provided in accordance with the embodiments described herein can absorb such reflections and reduce the noise caused by those reflections. As such, the reflection absorption circuits can facilitate the use of the packaged impedance transformers 308 (or other bandwidth limited output path devices, including but not limited to discretely packaged circulators) in the output paths amplifiers by reducing or substantially eliminating undesirable noise caused by reflections from the inputs of the packaged impedance transformers 308.

In this embodiment the packaged transistor device 302 includes two encased transistors, two input leads (on the left side of the device 302), and two output leads (on the right side of the device 302. Each encased transistor has its own input (i.e., the two encased transistors are implemented in parallel with each other, each connected between a different input/output lead pair). The printed circuit board 303 includes a plurality of conductive traces or portions, including two output traces 304, bias line portion 306, a combiner trace 310, and a ground reference trace 318 (corresponding to a ground reference node). For example, the traces 304, 310, 318 may be implemented as patterned portions of a conductive layer on a top surface of the printed circuit board 303. Each of the output traces 304, in combination with an output lead and conductive structures (e.g., wirebonds) inside the packaged transistor device 302) provides an electrical connection to the output (e.g., the drain terminal) of a corresponding transistor in the packaged transistor device 302. Specifically, each of the output traces 304 is coupled to a package output lead on the packaged transistor device 302. Furthermore, each of the output traces 304 is coupled to a different package lead on a corresponding one of the packaged impedance transformers 308. Thus, the output traces 304 provide the electrical connection between the output terminals of the transistors and the packaged impedance transformers 308. Finally, the output traces 304 each include a bias line portion 306 for providing bias voltages to the outputs of the transistors. The combiner trace 310 combines the outputs of the two transistors (or more specifically the outputs of the two packaged impedance transformers 308) and provides a phase delay to at least one of the amplification paths, as will be described in greater detail below. The ground reference trace 318 may be electrically connected to a system ground reference voltage.

Each packaged impedance transformer 308 is a implemented as a surface mount package (e.g., a QFN or other surface mount package) that is surface mounted to the printed circuit board 303. Each packaged impedance transformer 308 includes a first terminal (electrically coupled to one of traces 304), a second terminal (electrically coupled to a part of trace 310), and an internal impedance transformation circuit coupled between the first and second terminals of the impedance transformer 308.

In accordance with the embodiments described herein, a reflection absorption circuit 320, 340 is coupled to the output of each of the transistors in the packaged transistor device 302, and each reflection absorption circuit 320, 340 is implemented on the printed circuit board 303 (e.g., using discrete, surface-mounted, passive components). More specifically, each reflection absorption circuit 320, 340 is electrically connected to the output path of the transistor at a connection point between the transistor output (or an output lead of device 302) and an input terminal of a packaged impedance transformer 308. In the illustrated embodiment, each of the reflection absorption circuits 320, 340 includes two parallel circuits coupled between the transistor output and a ground reference trace 318. The two parallel circuits of reflection absorption circuit 320 include a first series circuit coupled between bias line portion 306 of trace 304 and 318 that includes a resistive element 328 (e.g., resistive element 208), capacitive element 324 (e.g. capacitive elements 204, 205), and inductive element 326 (e.g., capacitive element 206), and a second series circuit coupled between bias line portion 306 of trace 304 and 318 that includes a resistive element 338 (e.g., resistive element 218), capacitive element 334 (e.g. capacitive elements 214, 215), and inductive element 326 (e.g., capacitive element 316). The two parallel circuits of reflection absorption circuit 340 include a first series circuit coupled between bias line portion 306 of traces 304 and 318 that includes a resistive element 348 (e.g., resistive element 208), capacitive element 344 (e.g. capacitive elements 204, 205), and inductive element 346 (e.g., capacitive element 206), and a second series circuit coupled between bias line portion 306 of trace 304) and 318 that includes a resistive element 358 (e.g., resistive element 218), capacitive element 354 (e.g. capacitive elements 214, 215), and inductive element 356 (e.g., capacitive element 316).

In this particular embodiment each of the resistive element 328, 338, 348, 358, capacitive element 324, 334, 344, 354, and inductive element 326, 336, 346, 356 are formed as separate discrete devices (e.g., surface mount devices) that are mounted to the printed circuit board 303. More specifically, first and second terminals of each element 328, 338, 348, 358, 324, 334, 344, 354, 326, 336, 346, 356 are connected (e.g., soldered or conductively adhered) to conductive traces on the top surface of printed circuit board 303, and one of the conductive traces 318 is coupled to a ground reference node at a bottom surface of the printed circuit board 303 through conductive vias that extend between the top and bottom surfaces of the printed circuit board 303. Accordingly, the elements 312, 314, 316 are connected in series between the bias line portion 306 of the conductive output trace 304. However, in other embodiments one or more of these elements could be made from conductive traces or in some other manner. Further, the resistive, capacitive, and inductive elements 328, 338, 348, 358, 324, 334, 344, 354, 326, 336, 346, 356 could be interconnected in a different order from that shown in FIG. 3. Further still, although each reflection absorption circuit 320, 340 is shown to include two parallel RLC circuits, each reflection absorption circuit 320, 340 alternatively could include a single RLC circuit, or more than two parallel RLC circuits (e.g., four parallel RLC circuits, as shown in FIG. 2B, or some other number of parallel RLC circuits).

It should be noted that in the amplifier 300 the reflection absorption circuits 320, 340 are located in close physical proximity to the outputs of the transistors encased within the packaged transistor device 302. As used herein, "in close proximity", when referring to the proximity of a reflection absorption circuit (or more specifically a first terminal of a first series element of a reflection absorption circuit) means within about 22 electrical degrees to about 45 electrical degrees (~between 300 mils to 600 mils) of the output of a transistor, although "in close proximity" alternatively may mean a smaller or larger distance, as well. In this particular embodiment this is accomplished by coupling a first series element (e.g., capacitive element 328, 338, 348, 358) directly to the bias line portion 306 of the conductive output trace 304. Furthermore, the reflection absorption circuits 320, 340 are electrically coupled to nodes between the output of the transistors and the inputs to the packaged impedance transformers 308. Providing the reflection absorption circuits 320, 340 between the output of the transistors and the inputs to the packaged impedance transformers 308 allows the reflection absorption circuits 320, 340 to absorb signal energy in reflections from the inputs to those packaged impedance transformers 308. This allows such packaged impedance transformers 308 to be used as part of the output matching network of the amplifier even when the packaged impedance transformers 308 are bandwidth limited, and without causing degradation in various other amplifier performance criteria.

It should be noted that the amplifier 300 is just one example implementation, and that other implementations are possible. For example, in some cases one or more elements of the reflection absorption circuits 320, 340 can be packaged with the transistors in the packaged transistor device 302. In such embodiments these elements of the reflection absorption circuits can be formed on or attached to a separate die or substrate (e.g., an IPD die, small PCB, LTCC substrate, and so on), and then packaged in the same package as the transistor dies. Inductive elements could be formed from wirebonds, or in/on the aforementioned dies or substrates. In other embodiments one or more of these elements of the reflection absorption circuits could be integrated within and/or connected to the same die as the transistor. The term "package", "package device", or "packaged transistor device", as used herein means a collection of structural components (e.g., including a flange or other package substrate) to which the primary electrical components (e.g., input and output leads, transistor dies, IPD dies, and various electrical interconnections) are coupled and/or encased. The package, package device, or packaged transistor device is thus a distinct device that may be mounted to a printed circuit board or other substrate that includes other devices and portions of a circuit. As specific examples, the package, package device, or packaged transistor device can comprise an air cavity or over-molded package having a suitable package substrate, input lead(s), and output lead(s). In addition, the package, packaged device, or packaged transistor device could be implemented using other packaging configurations than those shown in the figures, such as but not limited to no-leads packages (e.g., quad flat no-leads, QFN), or other package types.

Figure 4:
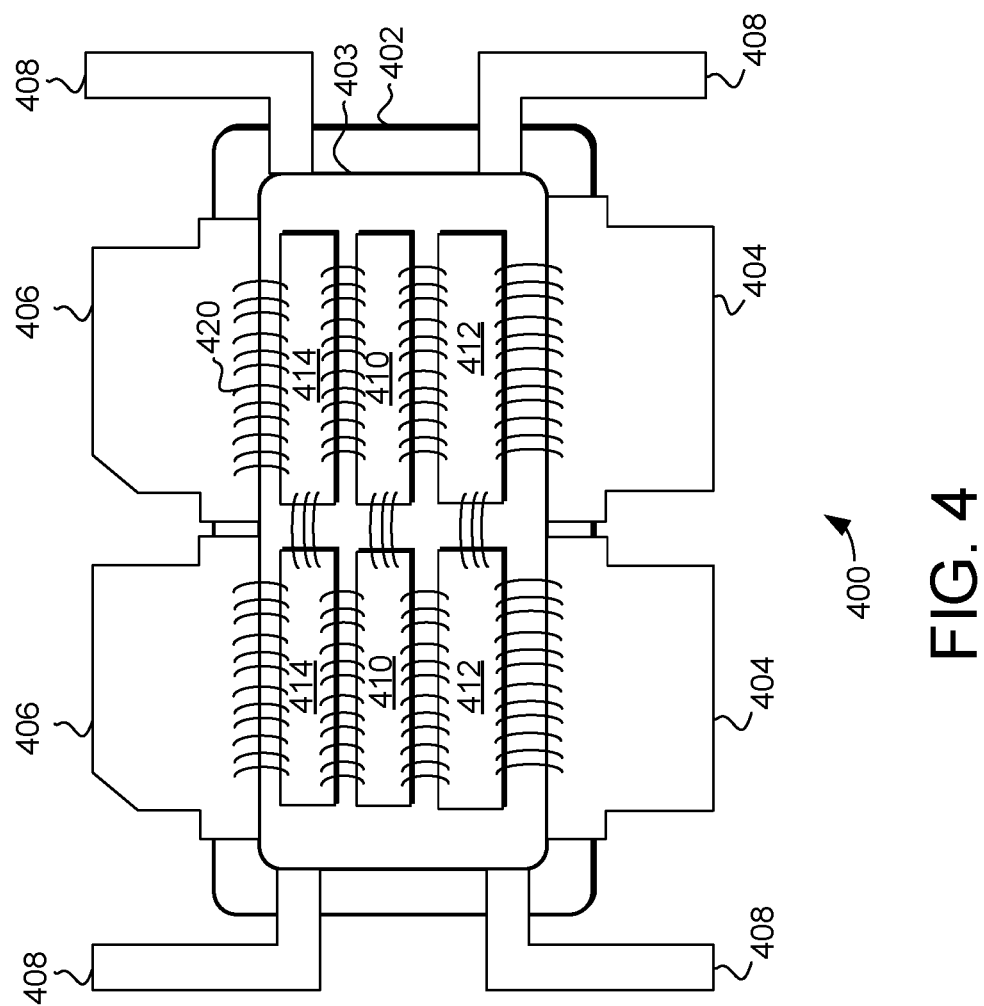
FIG. 4 is a top view of a packaged amplifier in accordance with an example embodiment.

Turning now to FIG. 4, a top view of a portion of an exemplary amplifier 400 that is implemented within a discrete device package 402 is illustrated. The package 402 includes a package substrate 403, input leads 404, output leads 406 and biasing leads 408. The package substrate 403 (e.g., flange or other substrate with a conductive top surface that serves as a ground plane) serves as a structural component to which various semiconductor dies are mounted or otherwise connected. The device package 402 also may include an isolator that electrically isolates the package substrate from the leads 404, 406 and 408, or alternatively may include encapsulation that provides such electrical isolation. The package 402 may be an air-cavity package or a plastic encapsulated (overmolded) package.

In this example, amplifier 400 implements two amplification paths, with each amplification path including an input IPD die 412, a transistor die 410, and an output IPD die 414, all encased together in one package 402. Each transistor die 410 can include one ore more integrated transistors (e.g., silicon-based or III-V-based FETs). In one embodiment in which the amplifier 400 forms a portion of a Doherty amplifier (as described in more detail in conjunction with FIG. 5), one of the transistor dies 410 can function as a carrier transistor, and the other transistor die 410 can function as one or more peaking transistors, with each transistor formed on a corresponding semiconductor die. Likewise, in some embodiments portions of input matching networks can be implemented on the input IPD dies 412, and portions of output matching networks can be implemented on the output IPD dies 414.

In this implementation the input leads 404 are each configured to receive an RF signal (e.g., from a signal divider that is implemented on a PCB to which the package 402 is coupled), and bond wire arrays 420, which may form portions of the input matching components, connect the input leads 404 to input IPD dies 412, and connect the IPD dies 412 to the control terminals (e.g., gates) of the transistors within transistor dies 410. Likewise, various bond wire arrays 420, which may form portions of the output matching components, connect the output IPD dies 414 to the output leads 406, and connect the output IPD dies 414 to the output terminals (e.g., drain terminals) of the transistors within transistor dies 410.

In accordance with the embodiments described herein, one or more components of reflection absorption circuits (e.g., reflection absorption circuits 106, 200, 220, 320, 340) are included inside the package 402. For example, various resistive, capacitive and inductive elements can be integrated within, formed on, or attached to the output IPD dies 414. Furthermore, various discrete devices can be additionally included inside the package 402. Finally, in some embodiments inductive elements can be provided with the bond wire arrays 420.

As was described, in some implementations the reflection absorption circuits described above can be included in Doherty amplifiers. In general, a Doherty amplifier divides an input RF signal and uses amplifiers of different classes to amplify the divided parts of the RF signal, after which the amplified signals are combined. Specifically, a Doherty amplifier typically uses a carrier amplifier in parallel with one or more peaking amplifiers, with the carrier amplifier used to amplify relatively low power input signals, and both the carrier amplifier and the one or more peaking amplifiers used to amplify relatively high power input signals (e.g., the peaks of the signal). In such an implementation, the carrier amplifier is typically biased to operate as a class AB driver, and the peaking amplifier(s) are biased to operate as class C drivers.

In such an embodiment, the carrier amplifier can comprise one or more transistors (e.g., including a driver transistor and a final stage transistor, or just a final stage transistor), and the peaking amplifier can comprise one or more other transistors (e.g., including a driver transistor and a final stage transistor, or just a final stage transistor). Thus, single stage (e.g., single transistor) carrier and peaking amplifiers can be used in some embodiments, and other embodiments can include multiple-stage amplifiers (e.g., in which each amplification path includes a driver amplifier (transistor) and a final-stage amplifier (transistor) coupled in series).

In a typical Doherty implementation, when the input RF signal is at relatively low signal levels, the carrier amplifier operates near its compression point and thus with high efficiency, while the peaking amplifier(s) are not operating. Thus, at relatively low signal levels the Doherty amplifier can provide both high efficiency and good linearity. Then, when higher signal levels occur, the carrier amplifier compresses, and one or more of the peaking amplifier(s) start to operate to "top up" the resulting output signal. Thus, the peaking amplifier(s) provide the ability to achieve high power output during times of high input signal levels. Thus, the carrier and peaking amplifiers of the Doherty amplifier together can provide relatively high power output and high efficiency. Stated another way, Doherty amplifiers thus can combine class AB and class C amplifiers in a way that maintains linearity while providing high power efficiency, and can further provide a high power output.

Figure 5:
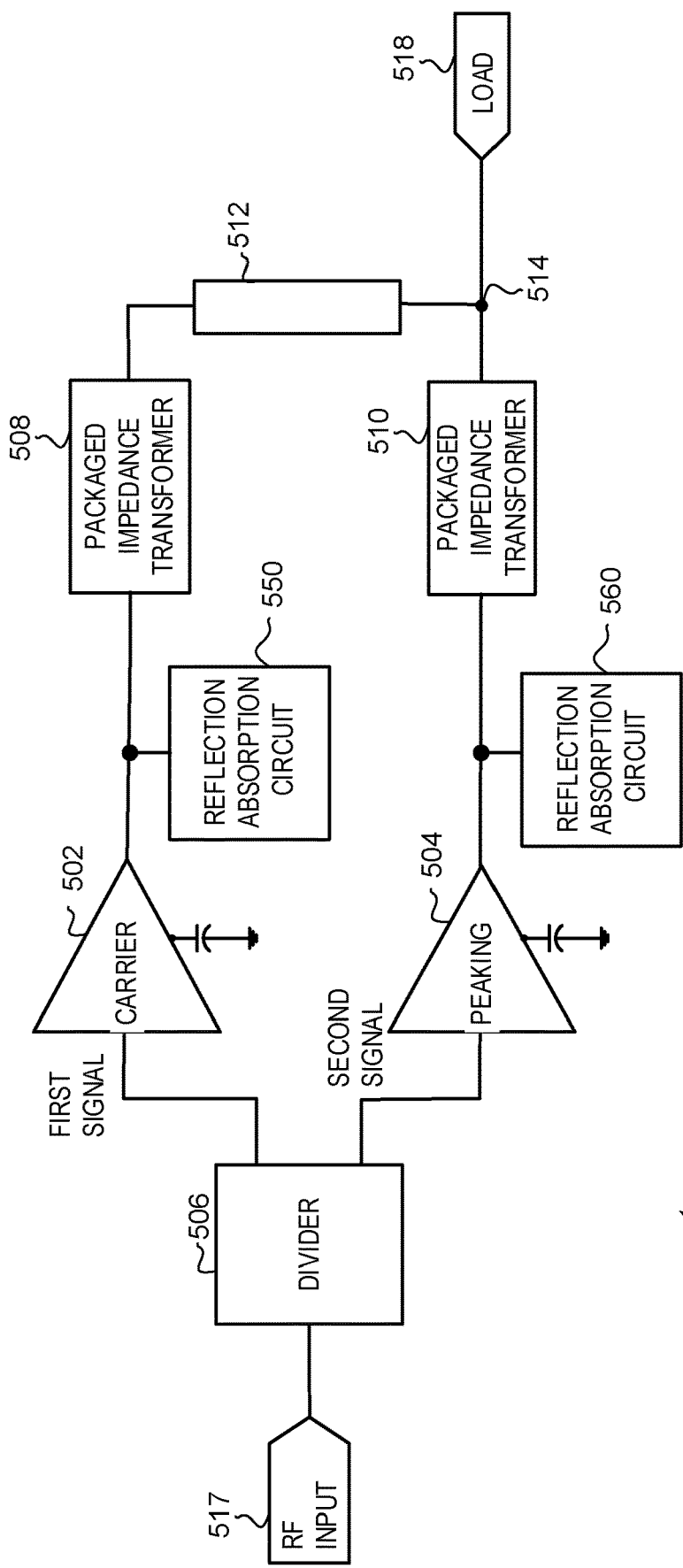
FIG. 5 is a schematic diagram of a Doherty amplifier in accordance with an example embodiment.

Turning now to FIG. 5, a circuit diagram representing a portion of an exemplary amplifier 500 is illustrated. In this illustrated embodiment, the amplifier 500 is a Doherty amplifier that receives an RF input signal at the RF input 517 and drives an amplified signal to a load output 518. The amplifier 500 includes a carrier amplifier 502, a peaking amplifier 504, a divider 506, a first packaged impedance transformer 508, a second packaged impedance transformer 510, an additional impedance transformer and/or phase shifter 512, a combining node 514, a first reflection absorption circuit 550, and a second reflection absorption circuit 560.

In a typical embodiment, the divider 506 receives an RF signal and generates two output signals that are 90 degrees out of phase with each other. These two outputs correspond to the first signal and second signal that are applied to the carrier amplifier 502 and peaking amplifier 504 respectively. The two outputs can be in the form of equal-power or unequal-power signals. The 90 degree phase difference can be provided by a phase delay element that applies a phase shift of about 90 degrees to the second signal before outputting the second signal to the peaking amplifier 504. The 90 degree difference in phase allows the output of the peaking amplifier 504 to be in step with the carrier amplifier 502 output when combined at the combining node 514.

The amplifier 500 receives and amplifies the first signal and the phase delayed second signal, combines the amplified first and second signals in phase, and drives the combined signal to a load output 518. The carrier amplifier 502 includes one or more carrier transistors, and the peaking amplifier 504 includes one or more peaking transistors, and the outputs of the carrier and peaking transistors are coupled to packaged impedance transformers 508, 510, transformer/phase shifter 512, and combining node 514.

The packaged impedance transformers 508, 510 (e.g., packaged impedance transformers 308, FIG. 3) are configured to transform the impedance at the output of the transistors to one acceptable for the load. For example, the packaged impedance transformers 508, 510 can be impedance increasing transformers that increase the final output impedance of amplifier to a desired level. In one specific embodiment, the packaged impedance transformers 508, 510 comprise 4 ohm to 50 ohm transformers.

The packaged impedance transformers 508, 510 typically include one or more passive devices (inductors, capacitors, resistors) that are packed together in a semiconductor device package. Again, the "package" in this context means a collection of structural components (e.g., including a flange or other package substrate) to which the primary electrical components (e.g., input and output leads, passive devices, IPD dies, and various electrical interconnections) are coupled and/or encased. The packaged impedance transformers 508, 510 are thus devices that may be mounted to a PCB or other suitable substrate. Again, packaged impedance transformers 508, 510 can provide several potential advantages, but have generally not been used in output matching networks for high frequency high bandwidth amplifiers because of limitations in their effective bandwidth. When used with various embodiments of the inventive subject matter, the packaged impedance transformers 508, 510 can facilitate a reduction in overall amplifier size (or footprint) without significant performance degradation due to signal reflections produced at the inputs to the packaged impedance transformers 508, 510.

Conceptually, the transformer/phase shifter 512 can be considered to include a ¼ wave transformer. The transformer/phase shifter 512 and combining node 514 function as combiner that combines the outputs of the carrier amplifier 502 and peaking amplifier 504 such that the combined output can be delivered to the load output 518. To facilitate this, the combining node 514 is coupled to the load output 518. The transformer/phase shifter 512 may include a ¼ wave transformer, which provides a 90 degree phase shift to the output of the carrier amplifier 502 and thus facilitates the in-phase combining of that output with the output of the peaking amplifier 504. The transformer/phase shifter 512 also provides an impedance inversion between the outputs of the carrier amplifier 502 and the peaking amplifier 504. During operation, the impedance inversion effectively changes the impedance seen by the carrier amplifier 502 to provide an optimal load to the carrier amplifier 502 at and around the operational frequency.

In a typical Doherty implementation, the carrier amplifier 502 is biased to operate as a class AB amplifier, and is used to drive the main body of the output signal. Conversely, the peaking amplifier 504 is biased to operate as a class C amplifier, and is used to drive the peaks of the output signal. This use of the two amplifiers 502 and 504 as class AB and class C amplifiers with outputs that are combined together can provide both relatively high power output and high efficiency.

In a typical embodiment, the carrier amplifier 502 and peaking amplifier 504 would be implemented with suitable RF-capable transistors with relatively high power capability. For example, the carrier amplifier 502 and peaking amplifier 504 can be implemented with III-V type transistors (e.g., Gallium Nitride (GaN) transistors), silicon-based transistors (e.g., LDMOS FETs), or other types of transistors.

In accordance with the embodiments described herein, the Doherty amplifier 500 includes a first reflection absorption circuit 550 and a second reflection absorption circuit 560. The reflection absorption circuit 550 (e.g., circuit 160, 200, 220) is coupled to a node along a first amplification path between an output of a transistor in the carrier amplifier 502 and the packaged impedance transformer 508. Likewise, the reflection absorption circuit 560 (e.g., circuit 160, 200, 220) is coupled to a node along a second amplification path between an output of a transistor in a peaking amplifier 504 and the packaged impedance transformer 510. Again, each of these reflection absorption circuits 550, 560 is configured to absorb (e.g., dissipate or shunt to a ground reference node) reflected signal energy from the packaged impedance transformers 508, 510 and thus reduce the noise potentially associated with such signal energy.

In this particular embodiment the reflection absorption circuits 550, 560 are configured to absorb (e.g., dissipate or shunt to a ground reference node) signal energy that might be reflected back from the inputs of the packaged impedance transformers 508, 510. In this particular embodiment this is accomplished by coupling the reflection absorption circuit 550 between the first packaged impedance transformer 508 and the output of the carrier amplifier 502. Likewise, the reflection absorption circuit 560 is coupled between the second packaged impedance transformer 510 and the output of the peaking amplifier 504. Providing the reflection absorption circuits 550, 560 between the output of the amplifiers 502, 504 and the packaged impedance transformers 508, 510 allows the reflection absorption circuits to absorb reflections from those packaged impedance transformers 508, 510. Again, this allows such packaged impedance transformers 508, 510 to be used in the Doherty amplifier 500 even when the packaged impedance transformers 508, 510 are bandwidth limited.

As described above, the use of the reflection absorption circuits (106, 200, 220, 320, 340, 550, 560) can reduce the noise at the output of the amplifier (100, 300, 500) and thus provide improved amplifier performance. In some embodiments this can include a reduction in a type of noise referred to as intermodulation product distortions or intermodulation distortion. In general, intermodulation product distortions are unwanted modulations of signals that include two or more frequencies. Such intermodulation product distortions can be generated at harmonic frequencies, but also at sum and difference frequencies of the original frequencies and sum and difference frequencies of the multiples of the original frequencies.

Figure 6A:
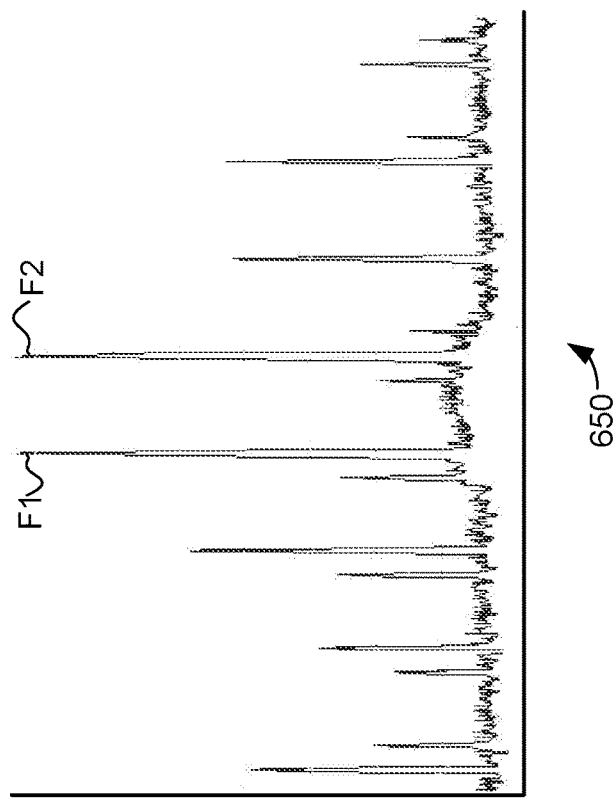
FIGS. 6A and 6B are graphs of exemplary spectrum plots.
Figure 6B:
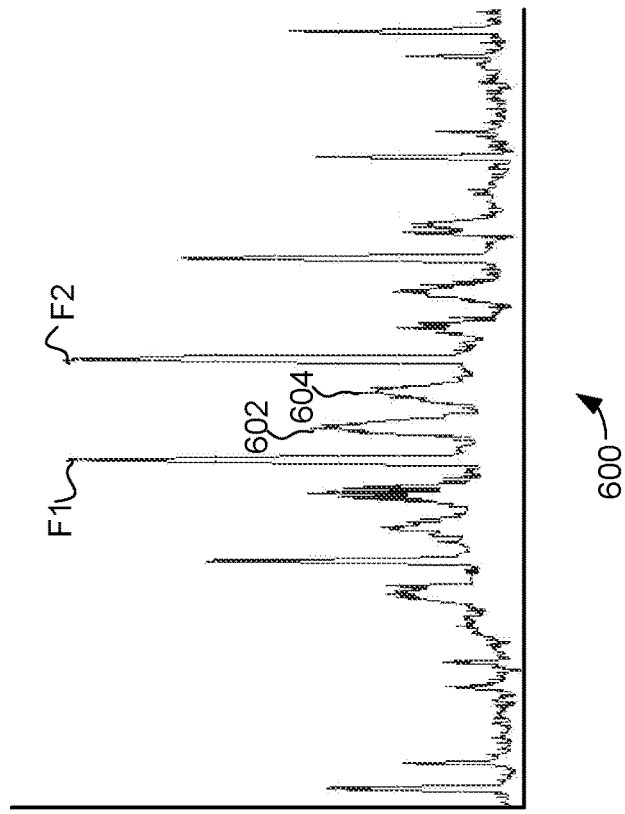

Turning now to FIGS. 6A and 6B, graphs 600 and 650 show spectrum plots of exemplary amplified RF signals. These spectrum plots show the power output versus frequency for the effective bandwidth of an exemplary high frequency, high bandwidth, high power RF amplifier.

Graph 600 shows a spectrum plot for the output of an amplifier that fails to mitigate effects of the significant unwanted intermodulation product distortions. Specifically, graph 600 shows intermodulation product distortions 602 and 604 that occur between two exemplary tone signal frequencies F1 and F2 in an amplifier that does not include reflection absorption circuits in accordance with the embodiments described herein. Such large intermodulation product distortions can be caused at least in part by signal energy reflecting back toward the output of the transistor. In this illustrated example the large intermodulation product distortions 602 and 604 that fall between the tone signal frequencies F1 and F2 are within the operational RF band thus can greatly impair wideband operation and reduce amplifier linearity.

Graph 650 shows a spectrum plot for the output of an exemplary amplifier that includes reflection absorption circuits that reduce (e.g. dissipate and/or shunt to a ground reference node) signal energy associated with unwanted intermodulation product distortions. Specifically, graph 650 shows that the intermodulation product distortions between tone signal frequencies F1 and F2 have been significantly reduced by the addition of the reflection absorption circuits in accordance with the embodiments described herein. This reduction in noise in general and intermodulation product distortions in particular can significantly improve the performance of the amplifier. Specifically, by reducing the intermodulation product distortions between F1 and F2 this implementation of reflection absorption circuits can increase amplifier linearity in high frequency, high bandwidth, high power RF amplifiers. For example, the reflection absorption circuits can facilitate high power pulse amplifiers with increased amplifier linearity.

In one embodiment, a radio frequency (RF) amplifier is provided, the RF amplifier configured to operate at a fundamental frequency ($f_0$), the RF amplifier comprising: a first transistor, wherein the first transistor includes a first transistor input and a first transistor output; a first output matching network coupled to the first transistor output, the first output matching network including a first output path device connected between the first transistor output and an output of the RF amplifier, the first output path device having a first effective bandwidth; and a first reflection absorption circuit, the first reflection absorption circuit coupled between the first transistor output and the first output path device and configured to absorb reflected first signal energy from the first output path device.

In another embodiment, a radio frequency (RF) amplifier is provided, the RF amplifier configured to operate at a fundamental frequency ($f_0$), the RF amplifier comprising: a printed circuit board with a first output trace; a first transistor, wherein the first transistor includes a first transistor output connected to the first output trace; a first output matching network coupled to the first transistor output through the first output trace, the first output matching network including a first packaged impedance transformer mounted to the printed circuit board, the first packaged impedance transformer having a first effective bandwidth; and a first reflection absorption circuit, the first reflection absorption circuit coupled between the first transistor output and the first packaged impedance transformer and configured to absorb reflected first signal energy from the first packaged impedance transformer, wherein the first reflection absorption circuit includes a first capacitor and a first inductor coupled to the first output trace of the printed circuit board.

In another embodiment, a Doherty radio frequency (RF) amplifier configured to amplify RF signals having a fundamental frequency ($f_0$) and a baseband frequency ($f_B$) is provided, the RF amplifier comprising: a divider configured to receive the RF signals and to divide the RF signals into first and second RF signals provided at a first divider output and a second divider output; a first transistor coupled to the first divider output, wherein the first transistor includes a first transistor input and a first transistor output, and wherein the first transistor is a carrier amplifier in the Doherty RF amplifier; a first output matching network coupled to the first transistor output, the first output matching network including a first impedance transformer, the first impedance transformer having a first effective bandwidth; a first reflection absorption circuit, the first reflection absorption circuit coupled between the first transistor output and the first impedance transformer and configured to absorb reflected first signal energy from the first impedance transformer; a second transistor coupled to the second divider output, wherein the second transistor includes a second transistor input and a second transistor output, and wherein the second transistor is a peaking amplifier in the Doherty RF amplifier; a second output matching network coupled to the second transistor output, the second output matching network including a second impedance transformer, the second impedance transformer having a second effective bandwidth; a second reflection absorption circuit, the second reflection absorption circuit coupled between the second transistor output and the second impedance transformer and configured to absorb reflected second signal energy from the second impedance transformer; and a combiner, the combiner coupled to the first transistor output and the second transistor output.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier configured to operate at a fundamental frequency ($f_0$), the RF amplifier comprising:
    a first transistor, wherein the first transistor includes a first transistor input and a first transistor output;
    a first output matching network coupled to the first transistor output, the first output matching network including a first output path device connected between the first transistor output and an output of the RF amplifier, the first output path device having a first effective bandwidth; and
    a first reflection absorption circuit, the first reflection absorption circuit coupled between the first transistor output and the first output path device and configured to absorb reflected first signal energy from the first output path device, wherein the first reflection absorption circuit comprises a first baseband termination circuit and a second baseband termination circuit in parallel with the first baseband termination circuit.

2. The RF amplifier of claim 1, wherein the first baseband termination circuit is configured to provide a low impedance path for signal energy at first frequencies below a baseband frequency ($f_B$) and wherein the second baseband termination circuit is configured to provide a low impedance path for signal energy at second frequencies below the baseband frequency.

3. The RF amplifier of claim 1, wherein the first baseband termination circuit includes a first capacitor and a first inductor coupled in series between the first transistor output and a ground reference node, the first capacitor and the first inductor configured to resonate at a first frequency below a baseband frequency ($f_B$).

4. The RF amplifier of claim 3, wherein the first capacitor and the first inductor are coupled to a first output trace on a printed circuit board to which the first transistor and the first output path device are coupled.

5. The RF amplifier of claim 2, wherein the first frequency below the baseband frequency ($f_B$) comprises a frequency between 0.2 $f_B$ and 0.8 $f_B$.

6. The RF amplifier of claim 1, wherein the first output path device comprises a packaged impedance transformer.

7. The RF amplifier of claim 6, wherein the packaged impedance transformer comprises a surface mount package.

8. The RF amplifier of claim 1, wherein the first output path device comprises a packaged impedance transformer configured to increase an impedance to 50 ohms.

9. The RF amplifier of claim 1, wherein the first output path device comprises a frequency circulator.

10. A radio frequency (RF) amplifier configured to operate at a fundamental frequency ($f_0$), the RF amplifier comprising:
    a first transistor, wherein the first transistor includes a first transistor input and a first transistor output, wherein the first transistor is formed on a first transistor die, and wherein the first transistor die is encased in a device package that includes at least a first input lead and a first output lead;
    a first output matching network coupled to the first transistor output, the first output matching network including a first output path device connected between the first transistor output and an output of the RF amplifier, the first output path device having a first effective bandwidth; and
    a first reflection absorption circuit, the first reflection absorption circuit coupled between the first transistor output and the first output path device and configured to absorb reflected first signal energy from the first output path device, wherein the first reflection absorption circuit includes at least a first inductance and a first capacitance, and wherein the first capacitance is formed on a first integrated passive device (IPD) die, and wherein the first IPD die is encased in the device package with the first transistor die.

11. The RF amplifier of claim 1, wherein the RF amplifier comprises a Doherty amplifier, and wherein the first transistor is a carrier transistor in the Doherty amplifier, and wherein the RF amplifier further comprises:
a second transistor, wherein the second transistor is a peaking transistor in the Doherty amplifier, and wherein the second transistor includes a second transistor input and a second transistor output;
a second output matching network coupled to the first transistor output, the second output matching network including a second output path device connected between the second transistor output and the output of the RF amplifier, the second output path device having a second effective bandwidth; and
a second reflection absorption circuit, the second reflection absorption circuit coupled between the second transistor output and the second output path device and configured to absorb reflected second signal energy from the second output path device.

12. A radio frequency (RF) amplifier configured to operate at a fundamental frequency ($f_0$), the RF amplifier comprising:
a printed circuit board with a first output trace;
a first transistor, wherein the first transistor includes a first transistor output connected to the first output trace;
a first output matching network coupled to the first transistor output through the first output trace, the first output matching network including a first packaged impedance transformer mounted to the printed circuit board, the first packaged impedance transformer having a first effective bandwidth; and
a first reflection absorption circuit, the first reflection absorption circuit coupled between the first transistor output and the first packaged impedance transformer and configured to absorb reflected first signal energy from the first packaged impedance transformer, wherein the first reflection absorption circuit includes a first capacitor and a first inductor coupled to the first output trace of the printed circuit board, and wherein the first reflection absorption circuit comprises a first baseband termination circuit and a second baseband termination circuit in parallel with the first baseband termination circuit.

13. The RF amplifier of claim 12, wherein the first baseband termination circuit is configured to provide a low impedance path for signal energy at first frequencies below a baseband frequency ($f_B$) and wherein the second baseband termination circuit is configured to provide a low impedance path for signal energy at second frequencies below the baseband frequency.

14. The RF amplifier of claim 13, wherein the first frequencies below the baseband frequency ($f_B$) comprise frequencies between 0.2 $f_B$ and 0.8 $f_B$.

15. The RF amplifier of claim 12, wherein the first packaged impedance transformer is configured to increase an impedance to 50 ohms.

16. The RF amplifier of claim 12, wherein the RF amplifier comprises a Doherty amplifier, and wherein the first transistor is a carrier transistor in the Doherty amplifier, and wherein the RF amplifier further comprises:
a second transistor connected to a second output trace of the printed circuit board, wherein the second transistor is a peaking transistor in the Doherty amplifier, and wherein the second transistor includes a second transistor output;
a second output matching network coupled to the second transistor output through the second output trace, the second output matching network including a second packaged impedance transformer mounted to the printed circuit board, and wherein the second packaged impedance transformer has a second effective bandwidth; and
a second reflection absorption circuit, the second reflection absorption circuit coupled between the second transistor output and the second packaged impedance transformer and configured to absorb reflected second signal energy from the second packaged impedance transformer, wherein the second reflection absorption circuit includes a second capacitor and a second inductor coupled to the second output trace of the printed circuit board.

17. A Doherty radio frequency (RF) amplifier configured to amplify RF signals having a fundamental frequency ($f_0$) and a baseband frequency ($f_B$), the RF amplifier comprising:
a divider configured to receive the RF signals and to divide the RF signals into first and second RF signals provided at a first divider output and a second divider output;
a first transistor coupled to the first divider output, wherein the first transistor includes a first transistor input and a first transistor output, and wherein the first transistor is a carrier amplifier in the Doherty RF amplifier;
a first output matching network coupled to the first transistor output, the first output matching network including a first impedance transformer, the first impedance transformer having a first effective bandwidth;
a first reflection absorption circuit, the first reflection absorption circuit coupled between the first transistor output and the first impedance transformer and configured to absorb reflected first signal energy from the first impedance transformer, wherein the first reflection absorption circuit comprises a first baseband termination circuit and a second baseband termination circuit in parallel with the first baseband termination circuit;
a second transistor coupled to the second divider output, wherein the second transistor includes a second transistor input and a second transistor output, and wherein the second transistor is a peaking amplifier in the Doherty RF amplifier;
a second output matching network coupled to the second transistor output, the second output matching network including a second impedance transformer, the second impedance transformer having a second effective bandwidth;
a second reflection absorption circuit, the second reflection absorption circuit coupled between the second transistor output and the second impedance transformer and configured to absorb reflected second signal energy from the second impedance transformer; and
a combiner, the combiner coupled to the first transistor output and the second transistor output.

18. The Doherty RF amplifier of claim 17, wherein the first impedance transformer comprises a first packaged impedance transformer mounted to a printed circuit board and wherein the second impedance transformer comprises a second packaged impedance transformer mounted to the printed circuit board.

* * * * *